United States Patent [19]

Chou

[11] Patent Number: 5,998,285
[45] Date of Patent: Dec. 7, 1999

[54] SELF-ALIGNED T-SHAPED PROCESS FOR DEEP SUBMICRON SI MOSFET'S FABRICATION

[75] Inventor: Kuo-Yu Chou, Hsinchu, Taiwan

[73] Assignee: Winbond Electronics Corp., Taiwan

[21] Appl. No.: 09/126,199

[22] Filed: Jul. 30, 1998

[51] Int. Cl.⁶ ................................................ H01L 21/336
[52] U.S. Cl. ........................ 438/585; 438/182; 438/183
[58] Field of Search .................................. 438/180–183, 438/574, 579, 585, 588

[56] References Cited

U.S. PATENT DOCUMENTS

| 5,858,843 | 1/1999 | Doyle et al. | 438/183 |
| 5,891,783 | 4/1999 | Liu et al. | 438/585 |
| 5,918,130 | 6/1999 | Hause et al. | 438/180 |

*Primary Examiner*—Olik Chaudhuri
*Assistant Examiner*—Anh Duy Mai
*Attorney, Agent, or Firm*—Fulbright & Jaworski L.L.P.

[57] ABSTRACT

A process is disclosed for the fabrication of a MOS device with a T-shaped gate electrode, in which a selective CVD technique has been utilized to simplify the T-shaped gate process. After the formation of the gate oxide layer, no reactive ion etching step is applied, and that avoids the plasma charging damage to the gate oxide. The lightly-doped-drain structure and heavily-doped drain and source areas are formed in a self-aligned manner during the T-shaped gate process. The present invention provides a high yield rate and cost-saving in the T-shaped gate process for MOS devices.

39 Claims, 5 Drawing Sheets

5,998,285

SELF-ALIGNED T-SHAPED PROCESS FOR DEEP SUBMICRON SI MOSFET'S FABRICATION

BACKGROUND OF THE INVENTION

1. Field of the Invention

The present invention relates in general to the fabrication of deep submicron Si MOSFETs with T-shaped gate electrode, and more particularly to the gate-oxide-damage-free fabrication of deep submicron Si MOSFETs with T-shaped gate electrode.

2. Description of the Related Art

At present, a great number of semiconductor components are fabricated using MOSFET technology. Because of the need for high level integration, the dimensions of each IC device on the wafer shrink tremendously. When the dimensions shrink to deep submicron range, the parasitic resistance of gate electrode increases significantly due to the shortening of channel length. The parasitic resistance of gate electrode in conjunction with the parasitic capacitance of the related circuits thereby leads to a degradation of speed response of the devices. Consequently, a low parasitic resistance of gate electrode becomes essential in ULSI (Ultra Large Scale Integration) manufacturing. There are some approaches to achieve a gate of low parasitic resistance, and one of them is a well-known T-shaped gate design.

The following illustrates a T-shaped gate process of the prior art for deep submicron Si MOSFET's fabrication.

(1) A gate oxide layer 12 having a thickness of about 4 nm is first thermally grown on a P-type Si substrate 11, as shown in FIG. 1A.

(2) Thereafter, an in situ P-doped 1st polysilicon layer 13 of about 200 nm in thickness is deposited on the gate oxide layer 12.

(3) Subsequently, a photolithographic process and a RIE (Reactive Ion Etching) plasma treatment are utilized to shape the 1st polysilicon layer 13 into a conventional gate electrode pattern, as shown in FIG. 1A.

(4) Next, using a LPCVD (Low Pressure Chemical Vapor Deposition) technique, a TEOS (Tetra-Ethyl-Ortho-Silicate)-oxide layer 14 having thickness of about 550 nm, which is thicker than the 1st polysilicon layer 13, is deposited on the top surface of the wafer, as shown in FIG. 1B.

(5) In a process shown in FIG. 1C, the top surface of the TEOS-oxide layer 14 is planarized by a CMP (Chemical Mechanical Polishing) technique.

(6) In a process shown in FIG. 1D, a BOE (Buffer Oxide Etch) etching step is utilized to remove part of the TEOS-oxide layer 14, and the remaining thickness of the TEOS-oxide layer 14 is kept about 100 nm. Therefore, the top of the 1st polysilicon layer 13 is exposed.

(7) In a process shown in FIG. 1E, a 2nd polysilicon layer 15 having thickness of about 200 nm is deposited on the top surface of the wafer.

(8) Thereafter, the as-deposited 2nd polysilicon layer 15 is being etched back to the top surface of the TEOS-oxide layer 14, and the remaining part of the 2nd polysilicon layer 15 in conjunction with the 1st polysilicon layer 13 forms a T-shaped polysilicon gate electrode, as shown in FIG. 1F.

(9) Finally, as shown in FIG. 1G, taking advantage of the remaining 2nd polysilicon layer 15 as a mask, a reactive ion etching of the TEOS-oxide layer 14 is then performed to expose the Si substrate 11 area before salicide process, which is another important process to lower the gate parasitic resistance.

However, in the aforementioned T-shaped gate processes, after the formation of the gate oxide layer 12, reactive ion etching steps are still required, and would cause serious plasma charging damage to the gate oxide. As the reactive ion etching is performed, some positive charges accumulate in the polysilicon layer, and some negative charges accumulate in the blocking capacitor of the reactor. As long as the etching is finished and the power is turned off, those positive and negative charges will gather on either side of the gate oxide layer, and a sufficient voltage may develop across the gate oxide to result in dielectric breakdown. In this case, the yield rate of the process will drop. There are other alternatives to achieve the T-shaped gate electrode, which demand several more photolithographic steps and are not cost effective.

SUMMARY OF THE INVENTION

It is therefore an object of the invention to provide a high-yield and cost-effective process for the fabrication of a MOS device with a T-shaped gate electrode.

In the process of the present invention, a selective CVD technique has been utilized to simplify the T-shaped gate process. After the formation of the gate oxide layer, no reactive ion etching step is applied. This arrangement avoids the plasma charging damage to the gate oxide. The lightly-doped-drain structure and heavily-doped drain and source areas are formed in self-aligned manner during the T-shaped gate process. This would further slash down the cost of the entire MOS fabrication process. Therefore, a high-yield and cost-saving T-shaped gate process for MOS devices is achieved by the present invention.

The steps involved in the process can be summarized as follows:

(1) Form a pad oxide layer and a silicon nitride layer in form of a gate shape on the P-type Si substrate.

(2) A self-aligned ion implanting process is applied to form lightly-doped-drain areas.

(3) Form a BPSG (Boron PhosphoSilicate Glass) layer and planarize the surface.

(4) Etch back the BPSG layer to expose the silicon nitride surface, and remove the Silicon Nitride layer and the pad oxide layer.

(5) Form a gate oxide layer in the active gate area and a 1st polysilicon layer on the entire wafer, and planarize the surface such that the respective surfaces of BPSG layer and the 1st polysilicon layer poses at the same level.

(6) Form 2nd polysilicon layer by a selective CVD technique, and thereby to achieve a T-shaped gate electrode.

(7) Another self-aligned ion implanting process is applied to form heavily-doped source and drain areas.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENTS

The following preferred embodiment along with FIGS. 2A to 2I illustrates the T-shaped gate process for deep submicron Si MOSFET's fabrication of the present invention.

Figure 1A:
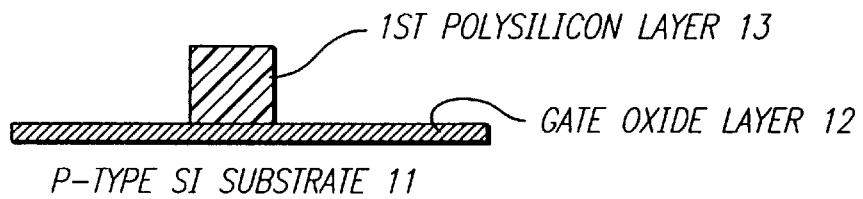
FIGS. 1A to 1G are cross-sectional views showing the processing steps of the conventional method in fabricating a MOS device with a T-shaped gate electrode.
Figure 1B:
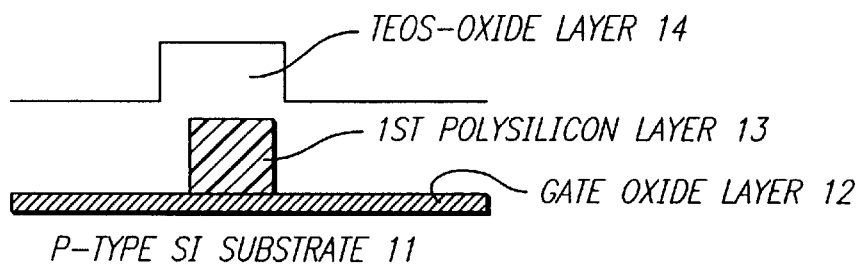
Figure 1C:
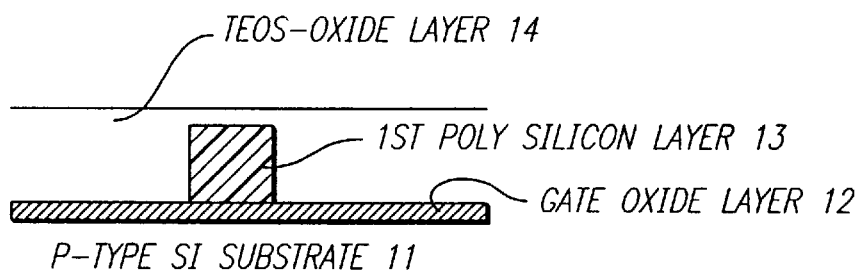
Figure 1D:
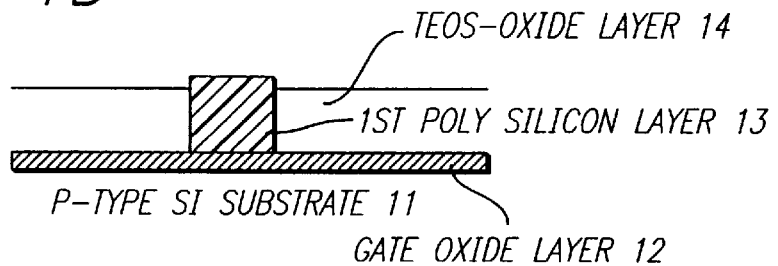
Figure 1E:
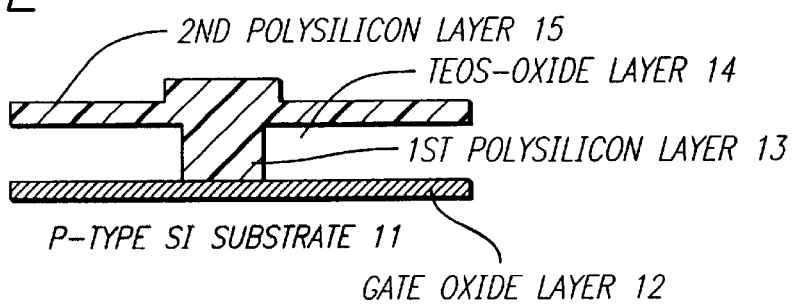
Figure 1F:
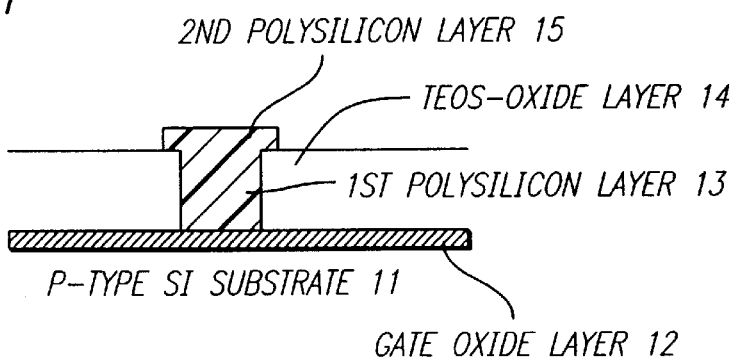
Figure 1G:
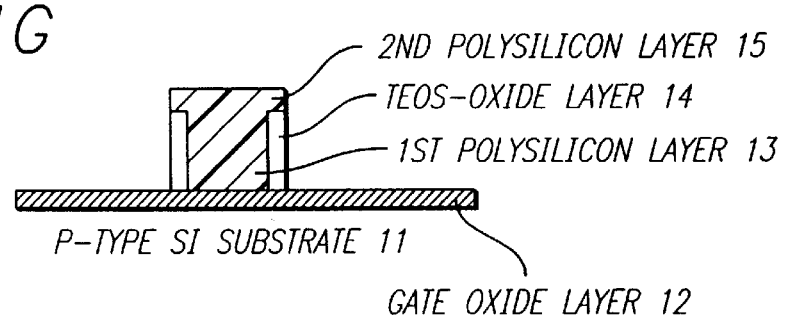
Figure 2A:
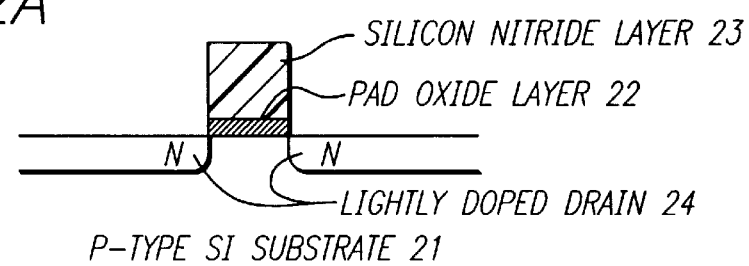
FIGS. 2A to 2I are cross-sectional views showing the processing steps according to one preferred embodiment of the invention.

(1) A pad oxide layer 22 having a thickness of about 200 Å is first deposited on a P-type Si substrate 21, as shown in FIG. 2A.

(2) Thereafter, a silicon nitride layer 23 having a thickness of about 2000 Å is deposited on the pad oxide layer 22.

(3) Subsequently, a photolithographic process and a RIE plasma treatment are utilized to shape the silicon nitride layer 23 and the pad oxide layer 22 into a gate electrode pattern, as shown in FIG. 2A;

(4) Next, as shown in FIG. 2A, a self-aligned ion implanting process is applied, over the exposed area of the P-type Si substrate 21, to form lightly-doped-drain areas.

Figure 2B:
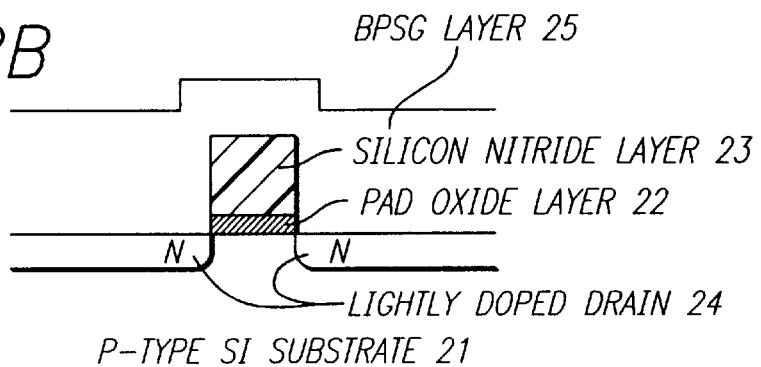

(5) In a process shown in FIG. 2B, a BPSG layer 25, with its thickness thicker than the combined thickness of the silicon nitride layer 23 and the pad oxide layer 22, is deposited on the entire wafer by a APCVD (Atmospheric Pressure Chemical Vapor Deposition) technique or a PECVD (Plasma Enhanced Chemical Vapor Deposition) technique.

Figure 2C:
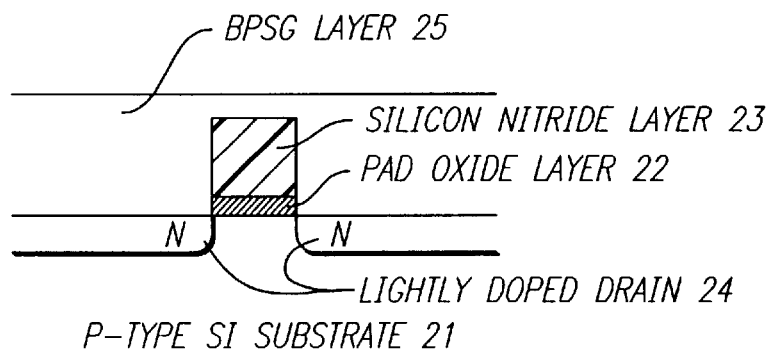

(6) In a process shown in FIG. 2C, a CMP planarization technique is utilized to planarize the surface of the BPSG layer 25.

Figure 2D:
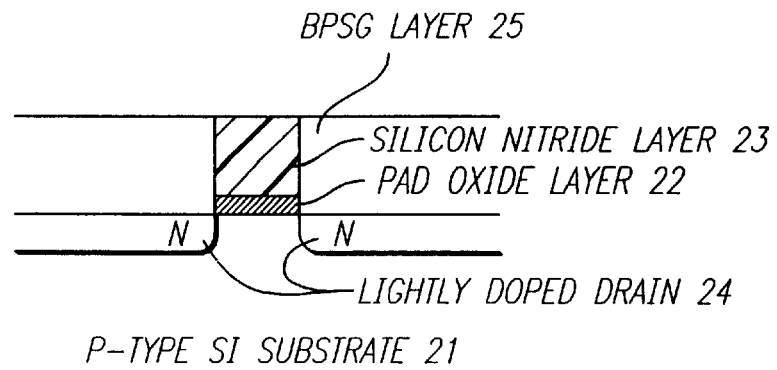

(7) In a process shown in FIG. 2D, the BPSG layer 25 is etched back to expose the top surface of silicon nitride layer 23.

Figure 2E:
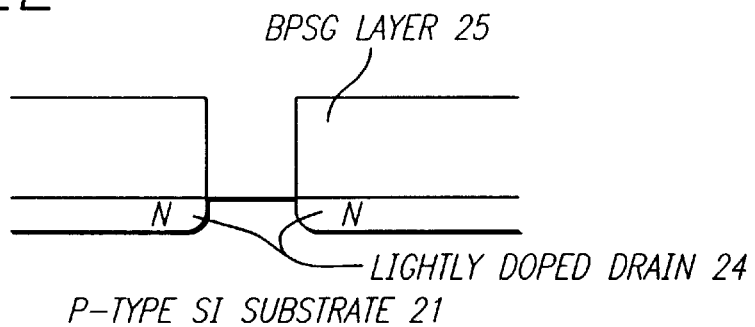

(8) In a process shown in FIG. 2E, the silicon nitride layer 23 and the pad oxide layer 22, which are enclosed by the BPSG layer 25, are removed by a wet or dry etching technique.

Figure 2F:
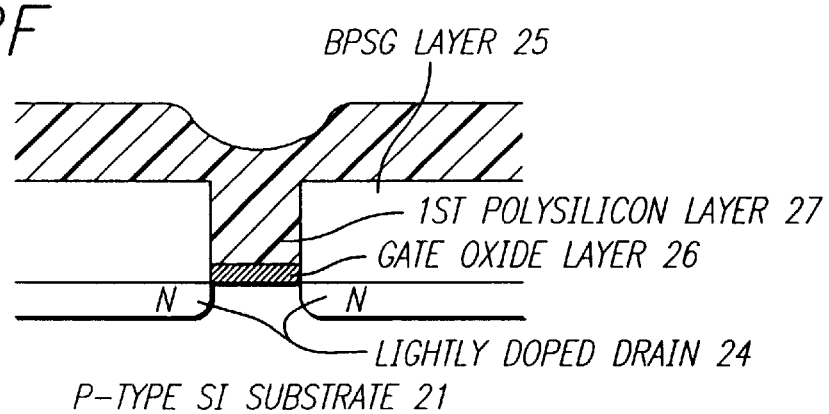

(9) In a process shown in FIG. 2F, a gate oxide layer 26 is thermally grown on the active gate area and a 1st polysilicon layer, with its thickness thicker than the remaining BPSG layer 25, is deposited on the entire wafer.

Figure 2G:
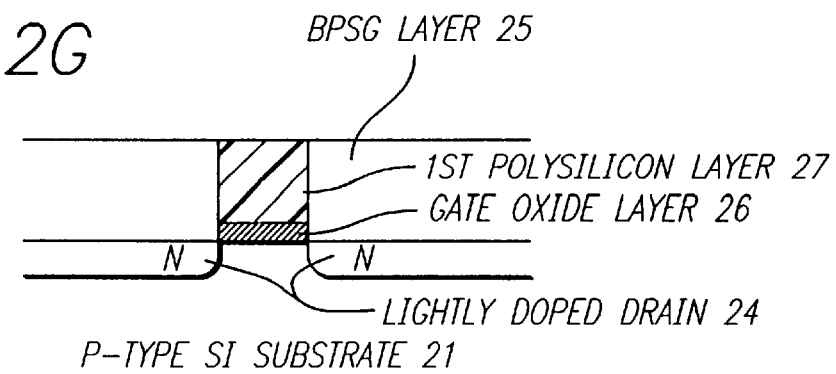

(10) In a process shown in FIG. 2G, a CMP technique is utilized to planarize the surface such that the respective surfaces of the BPSG layer and the 1st polysilicon layer poses at the same level.

Figure 2H:
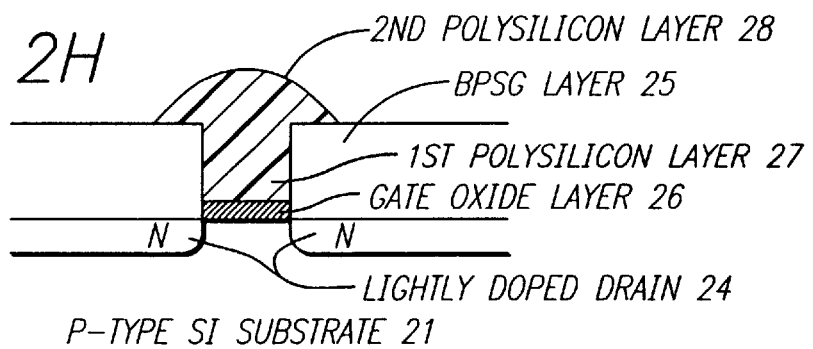

(11) In a process shown in FIG. 2H, making use of a selective chemical vapor deposition technique, a 2nd polysilicon layer 28 was deposited and thereby form a T-shaped gate electrode with 1st polysilicon layer 27. The selective chemical vapor deposition can be done by using dichlorocilane in an atmosphere of 800° C. and 25 torr.

Figure 2I:
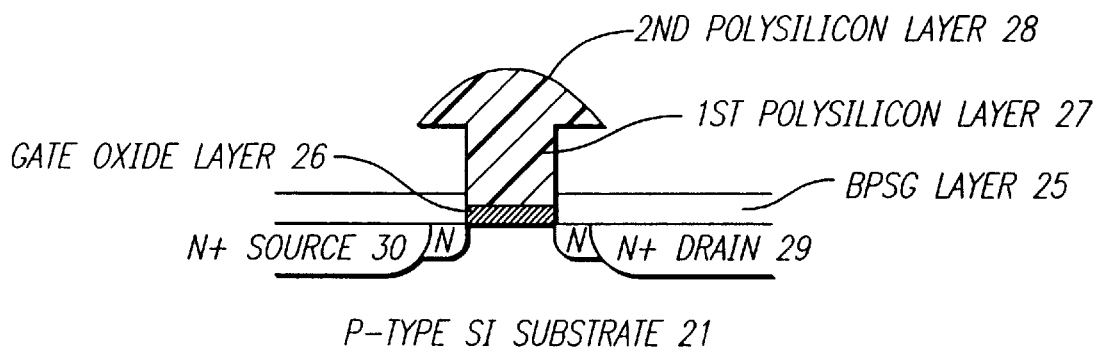

(12) In a process shown in FIG. 2I, the remaining BPSG layer 25 is removed by a wet etching technique.

(13) Finally, taking advantage of the 2nd polysilicon layer 28 as a mask, a self-aligned ion implanting process is applied to form heavily-doped drain area 29 and source areas 30.

In conclusion, from the description of this preferred embodiment, the invention has several intrinsic advantages.

(1) A selective CVD technique has been utilized to simplify the T-shaped gate process.

(2) After the formation of the gate oxide layer, no reactive ion etching step is applied, and that avoids the possible plasma charging damage to the gate oxide.

(3) The lightly-doped-drain structure and heavily-doped drain and source areas are formed by a self-aligned manner during the T-shaped gate process, and that would further slash down the cost of the entire MOS fabrication process.

The present invention has been described hitherto with a preferred embodiment. However, anyone who is skilled in the arts is likely to make various modifications and equivalent arrangements within the scope of the present invention. For example, the followings illustrate some possible alternatives according to the present invention.

Alternatively, the silicon substrate is N-type and the ion source of the ion implantation is P-type.

Alternatively, the processes of step 1 and step 2 can be simplified into one step, which deposits a dielectric layer over the P-type Si substrate 21. This dielectric layer performs the same function as the combined layers of the silicon nitride layer 23 and the pad oxide layer 22.

Alternatively, the BPSG layer in step 5 can be replaced by a PSG (PhosphoSilicate Glass), SOG (Spin-On Glass),or any other sacrificial dielectric material.

Alternatively, the BPSG layer in step 5 can be replaced by a two-layer structure, in which the bottom layer can be a TEOS-oxide layer and the upper layer can be a BPSG, PSG, SOG or any other sacrificial dielectric material.

Alternatively, the CMP planarization process can be replaced by a wet or dry etch-back process.

Alternatively, the BPSG layer in step 5 can be replaced also by a structure of more than two layers, in which the lowest layer can be a TEOS-oxide layer and the other upper layers can be BPSG, PSG, SOG, or any other sacrificial dielectric material. Therefore, after planarization, except part of the TEOS-oxide layer is remained, the other sacrificial layers is removed completely to elude any trouble caused by the outgassing of the sacrificial layers.

Alternatively, the processes in step 6 and step 7 can be simplified into one step, in which a planarization technique is utilized to planarize the surface of the BPSG layer and, at the same time, to expose the top surface of silicon nitride layer.

It is thereof to be understood that the scope of the present invention need not be limited to the disclosed preferred embodiments. On the contrary, it is intended to cover various modifications and equivalent arrangements within the scope defined in the following appended claims. The scope of the claims should be accorded the broadest interpretation so as to encompass all such modifications and equivalent arrangements.

What is claimed is:

1. A method of forming a T-shaped gate structure in a MOS device, comprising the steps of:

forming a dielectric layer on a 1st-type Si substrate, the dielectric layer defining a surface;

applying a photolithographic and etching procedure over the dielectric layer to form a gate electrode pattern;

injecting a 2nd-type ions into an area not masked by the dielectric layer by an ion implanting procedure;

depositing a dielectric sacrificial layer such that a top surface of the dielectric sacrificial layer is higher than the surface of the dielectric layer;

planarizing the top surface of the dielectric sacrificial layer such that the top surface of the dielectric layer is exposed;

removing, by an etching technique, a portion of the dielectric layer enclosed by the dielectric sacrificial layer such that a surface of the 1st-type Si substrate is exposed;

forming a gate oxide layer on the exposed surface of the 1st-type Si substrate;

depositing a 1st polysilicon layer over the gate oxide layer such that a top surface of the 1st polysilicon layer is higher than the surface of the dielectric sacrificial layer;

removing a portion of the 1st polysilicon layer which is above the surface of the dielectric sacrificial layer;

depositing a 2nd polysilicon layer and thereby forming the T-shaped gate electrode over the 1st polysilicon layer by a selective chemical vapor deposition procedure;

removing a portion of the dielectric sacrificial layer such that a thickness of a remaining portion of the dielectric sacrificial layer is larger than that of the gate oxide layer.

2. A method according to claim 1, wherein the 1st-type Si substrate is a P-type Si substrate and the 2nd-type ion source of the ion implantation is a N-type ion source.

3. A method according to claim 1, wherein the dielectric sacrificial layer is a BPSG (Boron PhosphoSilicate Glass) layer.

4. A method according to claim 1, wherein the dielectric sacrificial layer is a two-layer structure, in which a bottom layer is a TEOS-oxide layer and an upper layer is a BPSG layer.

5. A method according to claim 1, wherein the planarization procedure is a CMP (Chemical Mechanical Polishing) technique.

6. A method according to claim 1, wherein the planarization procedure is a wet or dry etch-back process.

7. A method according to claim 1, wherein the etching procedure is a wet or dry etching process.

8. A method according to claim 1, wherein the dielectric sacrificial layer is a three-layer structure, in which a lowest layer is a TEOS-oxide layer, a middle layer is a BPSG layer, and a top layer is a dielectric sacrificial layer.

9. A method according to claim 1, wherein further comprises forming a heavily-doped drain area and a heavily-doped source area by a self-aligned N-type ion implanting process using the 2nd polysilicon layer as a mask.

10. A method according to claim 1, wherein the dielectric layer is formed by the following steps:

depositing a pad oxide layer on the 1st-type Si substrate;

depositing a silicon nitride layer on the pad oxide layer.

11. A method according to claim 1, wherein the 1st-type Si substrate is a N-type Si substrate and the 2nd-type ion source of the ion implantation is a P-type ion source.

12. A method of forming a T-shaped gate structure in a MOS device, comprising the steps of:

forming a dielectric layer on a 1st-type Si substrate, the dielectric layer defining a surface;

defining an outline of a gate electrode over the dielectric layer and applying a etching procedure over the dielectric layer to form a gate electrode pattern;

injecting a 2nd-type ions into an area not masked by the dielectric layer;

forming a dielectric sacrificial layer such that a top surface of the dielectric sacrificial layer is higher than the surface of the dielectric layer;

planarizing the top surface of the dielectric sacrificial layer such that the top surface of the dielectric layer is exposed;

removing a portion of the dielectric layer enclosed by the dielectric sacrificial layer such that a surface of the 1st-type Si substrate is exposed;

forming a gate oxide layer on the exposed surface of the 1st-type Si substrate;

forming a 1st polysilicon layer over the gate oxide layer such that a top surface of the 1st polysilicon layer is higher than the surface of the dielectric sacrificial layer;

removing a portion of the 1st polysilicon layer which is above the surface of the dielectric sacrificial layer;

depositing a 2nd polysilicon layer and thereby forming the T-shaped gate electrode over the 1st polysilicon layer by a selective chemical vapor deposition procedure;

removing a portion of the dielectric sacrificial layer such that a thickness of a remaining portion of the dielectric sacrificial layer is larger than that of the gate oxide layer.

13. A method according to claim 12, wherein the outline define step for the gate electrode is achieved by a photolithographic procedure.

14. A method according to claim 12, wherein the ion injection step is accomplished by an ion implanting process.

15. A method according to claim 12, wherein the dielectric sacrificial layer is formed by a deposition process.

16. A method according to claim 12, wherein the removal step of the dielectric layer is accomplished by an etching technique.

17. A method according to claim 12, wherein the gate oxide is formed by a growth process.

18. A method according to claim 12, wherein the 1st polysilicon layer is formed by a deposition process.

19. A method according to claim 12, wherein the 1st-type Si substrate is a P-type Si substrate and the 2nd-type ion source of the ion implantation is a N-type ion source.

20. A method according to claim 12, wherein the dielectric sacrificial layer is a BPSG (Boron PhosphoSilicate Glass) layer.

21. A method according to claim 12, wherein the dielectric sacrificial layer is a two-layer structure, in which a bottom layer is a TEOS-oxide layer and an upper layer is a BPSG layer.

22. A method according to claim 12, wherein the planarization procedure is a CMP (Chemical Mechanical Polishing) technique.

23. A method according to claim 12, wherein the planarization procedure is a wet or dry etch-back process.

24. A method according to claim 12, wherein the etching procedure a wet or dry etching process.

25. A method according to claim 12, wherein the dielectric sacrificial layer is a three-layer structure, in which a lowest layer is a TEOS-oxide layer, a middle layers is a BPSG layer, and a top layer is a dielectric sacrificial layer.

26. A method according to claim 12, wherein further comprises forming a heavily-doped drain area and a heavily-doped source area by a self-aligned N-type ion implanting process using the 2nd polysilicon layer as a mask.

27. A method according to claim 12, wherein the dielectric layer is formed by the following steps:

depositing a pad oxide layer on the 1st-type Si substrate;

depositing a silicon nitride layer on the pad oxide layer.

28. A method according to claim 12, wherein the 1st-type Si substrate is a N-type Si substrate and the 2nd-type ion source of the ion implantation is a P-type ion source.

29. A method of forming a T-shaped gate structure in a MOS device, the method being characterized in that: forming a dielectric layer on a 1st-type Si substrate, the dielectric layer defining a surface; defining an outline of a gate electrode over the dielectric layer and applying an etching procedure over the dielectric layer to form a gate electrode pattern; injecting a 2nd-type ions into an area not masked by the dielectric layer; forming a dielectric sacrificial layer such that a top surface of the dielectric sacrificial layer is higher than the surface of the dielectric layer; planarizing the top surface of the dielectric sacrificial layer such that the top surface of the dielectric layer is exposed; removing a portion of the dielectric layer enclosed by the dielectric sacrificial layer such that a surface of the 1st-type Si substrate is exposed; forming a gate oxide layer on the exposed surface of the 1st-type Si substrate; forming a 1st polysilicon layer over the gate oxide layer such that a top surface of the 1st polysilicon layer is higher than the surface of the dielectric sacrificial layer; removing a portion of the 1st polysilicon layer which is above the surface of the dielectric sacrificial layer; depositing a 2nd polysilicon layer and thereby forming the T-shaped gate electrode over the 1st polysilicon layer by a selective chemical vapor deposition procedure; removing a portion of the dielectric sacrificial layer such that a thickness of a remaining portion of the dielectric sacrificial layer is larger than that of the gate oxide layer.

30. A method according to claim 29, wherein the 1st-type Si substrate is a P-type Si substrate and the 2nd-type ion source of the ion implantation is a N-type ion source.

31. A method according to claim 29, wherein the dielectric sacrificial layer is a BPSG (Boron PhosphoSilicate Glass) layer.

32. A method according to claim 29, wherein the dielectric sacrificial layer is a two-layer structure, in which a bottom layer is a TEOS-oxide layer and an upper layer is a BPSG layer.

33. A method according to claim 29, wherein the planarization procedure is a CMP (Chemical Mechanical Polishing) technique.

34. A method according to claim 29, wherein the planarization procedure is a wet or dry etch-back process.

35. A method according to claim 29, wherein the etching step is a wet or dry etching process.

36. A method according to claim 29, wherein the dielectric sacrificial layer is a three-layer structure, in which a lowest layer is a TEOS-oxide layer, a middle layers is a BPSG layer, and a top layer is a dielectric sacrificial layer.

37. A method according to claim 29, wherein further comprises forming a heavily-doped drain area and a heavily-doped source area by a self-aligned N-type ion implanting process using the 2nd polysilicon layer as a mask.

38. A method according to claim 29, wherein the dielectric layer is formed by the following steps:

depositing a pad oxide layer on the 1st-type Si substrate;

depositing a silicon nitride layer on the pad oxide layer.

39. A method according to claim 29, wherein the 1st-type Si substrate is a N-type Si substrate and the 2nd-type ion source of the ion implantation is a P-type ion source.

* * * * *